United States Patent
Rankin et al.

(10) Patent No.: US 10,396,811 B1
(45) Date of Patent: Aug. 27, 2019

(54) TEMPERATURE COMPENSATION FOR REFERENCE VOLTAGES IN AN ANALOG-TO-DIGITAL CONVERTER

(71) Applicant: GLOBALFOUNDRIES Inc., Grand Cayman (KY)

(72) Inventors: John Rankin, Raleigh, NC (US); Hayden Cranford, Jr., Cary, NC (US); Stacy Garvin, Durham, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/248,290

(22) Filed: Jan. 15, 2019

(51) Int. Cl.
| | |
|---|---|
| H03M 1/06 | (2006.01) |
| H03M 1/10 | (2006.01) |
| G05F 3/26 | (2006.01) |
| G05F 3/08 | (2006.01) |

(52) U.S. Cl.
CPC ....... H03M 1/0617 (2013.01); H03M 1/1014 (2013.01); *G05F 3/08* (2013.01); *G05F 3/267* (2013.01); *H03M 1/0607* (2013.01)

(58) Field of Classification Search
CPC ............. H03M 1/0617; H03M 1/1014; H03M 1/0607; G05F 3/267; G05F 3/08
USPC .......................................... 341/119, 120, 155
See application file for complete search history.

(56) References Cited

U.S. PATENT DOCUMENTS

| | | | |
|---|---|---|---|
| 7,161,512 B1 | 1/2007 | Keskin | |
| 7,271,758 B2 | 9/2007 | Piasecki et al. | |
| 8,390,491 B2 | 3/2013 | Wakimoto | |
| 8,436,677 B2 | 5/2013 | Kull et al. | |
| 8,547,270 B1 | 10/2013 | Strode | |
| 9,223,332 B1 | 12/2015 | Himmelbauer et al. | |
| 9,584,150 B2 | 2/2017 | Bogner | |
| 10,187,079 B1* | 1/2019 | Sharif | H03M 1/38 |
| 10,243,579 B2* | 3/2019 | Lee | H03M 1/0626 |
| 10,250,277 B1* | 4/2019 | Sim | H03M 3/464 |
| 10,263,629 B2* | 4/2019 | Wen | H03M 1/1009 |
| 2017/0047940 A1 | 2/2017 | de Figueiredo et al. | |

OTHER PUBLICATIONS

Fang et al., "A 5-GS/s 10-b 76-mW Time-Interleaved SAR ADC in 28 nm CMOS" IEEE Transactions on Circuits and Systems—I: Regular Papers, vol. 64, No. 7, Jul. 2017.

* cited by examiner

*Primary Examiner* — Brian K Young
(74) *Attorney, Agent, or Firm* — Thompson Hine LLP; David Cain

(57) ABSTRACT

Circuits for a successive approximation register analog-to-digital converter and related methods. A global reference circuit includes a first super source follower (SSF) circuit having an input coupled to an output of a first current mirror and to a first adjustment circuit, and an operational amplifier having an input coupled to an output of the first SSF circuit and an output coupled to an input of the first current mirror. Local slices each include a second current mirror having an input coupled to the output of the operational amplifier, a second super source follower (SSF) circuit having an input coupled to an output of the second current mirror and to a second adjustment circuit. The first and second adjustment circuits may be configured to adjust a voltage at the input of the first SSF circuit and respective voltages at the input of the second SSF circuit of each local slice.

20 Claims, 4 Drawing Sheets

TEMPERATURE COMPENSATION FOR REFERENCE VOLTAGES IN AN ANALOG-TO-DIGITAL CONVERTER

BACKGROUND

The present disclosure generally relates to electrical circuits, and more specifically, to circuits for a successive approximation register (SAR) analog-to-digital converter (ADC) and methods of temperature compensation in a SAR ADC.

A successive approximation register (SAR) analog-to-digital converter (ADC) commonly employs a capacitive digital-to analog converter (CDAC) in which the constituent capacitors are switched between a reference voltage and ground to set an appropriate output voltage. Although an ideal CDAC produces an analog output voltage or current that is precisely linear, real-world CDACs are subject to influence by external factors, such as temperature, and are therefore susceptible to errors. For example, as temperature varies, the CDAC reference voltage may drift and, accordingly, a gain error may be introduced. While an SAR ADC can be calibrated to compensate for gain errors at a constant temperature, it is much more difficult to compensate for gain errors resulting from temperature variations; i.e., it is impractical for circuit designers to calibrate to compensate for gain errors resulting from temperature drift of voltage output by the CDAC.

Accordingly, improved circuits and methods for controlling the gain of an SAR ADC to compensate for variations in temperature are needed.

SUMMARY

In an embodiment, circuit includes a global reference circuit having a first current mirror having an input and an output, a first super source follower (SSF) circuit having an input coupled to the output of the first current mirror and an output, a first adjustment circuit coupled to the input of the first SSF circuit, and an operational amplifier including a non-inverting input coupled by a feedback loop to the output of the first SSF circuit, an inverting input coupled to a global constant reference voltage, and an output coupled to the input of the first current mirror. The circuit further includes a plurality of successive approximation register (SAR) local slices. Each SAR local slice includes a second current mirror having an input coupled to the output of the operational amplifier and an output, a second super source follower (SSF) circuit having an input coupled to the output of the second current mirror, and a second adjustment circuit coupled to the input of the second SSF circuit. The first adjustment circuit may be configured to adjust a first voltage at the input of the first SSF circuit, and the second adjustment circuit may be configured to adjust a second voltage at the input of the second SSF circuit of each SAR local slice.

In an embodiment, a method is provided to provide gain compensation for a successive approximation register analog-to-digital converter. The method includes comparing an output of a global reference buffer to a value of a global constant voltage reference using an operational amplifier, supplying a current mirror bias voltage from an output of the operational amplifier, and distributing the current mirror bias voltage to a plurality of successive approximation register (SAR) local slices. The method further includes adjusting a first voltage at an input of a first super source follower (SSF) circuit of the global reference buffer, and adjusting a second voltage at an input of a second super source follower (SSF) circuit of each SAR local slice.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
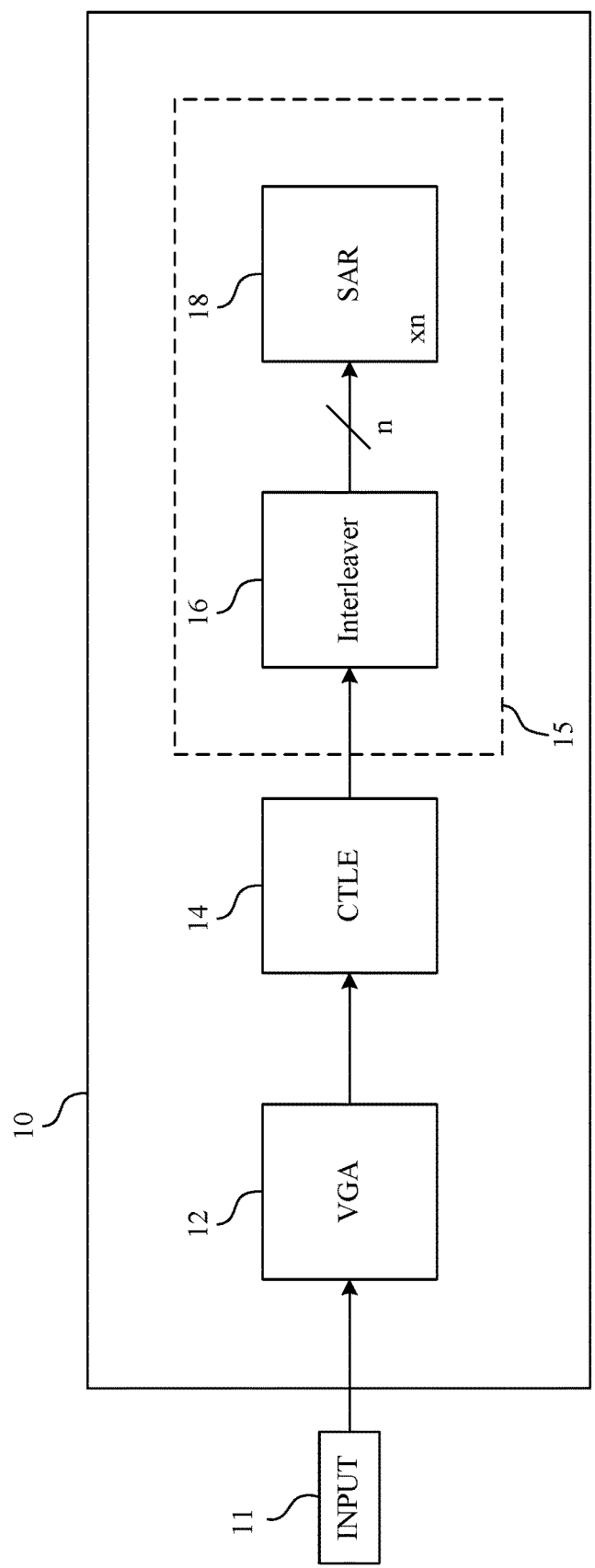
FIG. 1 is a circuit diagram of an exemplary receiver circuit that includes an analog-to-digital converter.

With reference to FIG. 1, a receiver circuit 10 includes an analog-to-digital converter (ADC) 15 that is configured to sample analog input signals and to convert the analog input signals into digital outputs. Because the number of digital outputs is finite, the ADC 15 may be configured with sufficient resolution to provide digital outputs that closely represent the analog input signals. For example, the ADC 15 may be configured to convert a continuous analog waveform into a discrete digital representation via a binary search through all possible quantization levels before converging upon a digital output for each conversion. Through the process of time interleaving identical ADCs, i.e., "slices", the ADC 15 may be configured to process sample data at a faster rate than the operating sample rate of each individual ADC slice. The ADC 15 may include a time-multiplexed parallel array of n identical ADC slices of a successive approximation register (SAR) 18 to achieve a higher net sample rate, even though each individual slice in the array is actually sampling at a lower rate.

As shown in FIG. 1, input 11 may be provided to a variable-gain amplifier (VGA) 12. In order to avoid issues resulting from SAR gain temperature variation, such as saturation of the ADC 15 leading to signal nonlinearity or increased signal-to-noise ratio through the ADC 15, the receiver circuit 10 may compensate for SAR gain temperature variation by varying a gain of VGA 12 based on temperature. In order to operate reliably over multiple channels at high data rates, the ADC receiver circuit 10 may supply the output of VGA 12 to an equalizer circuit in the representative form of a continuous-time linear equalizer (CTLE) 14. An interleaver 16 may sample an output of the CTLE 14 and provide lower frequency samples to each of the n-number of ADC slices of the SAR 18.

Figure 2:
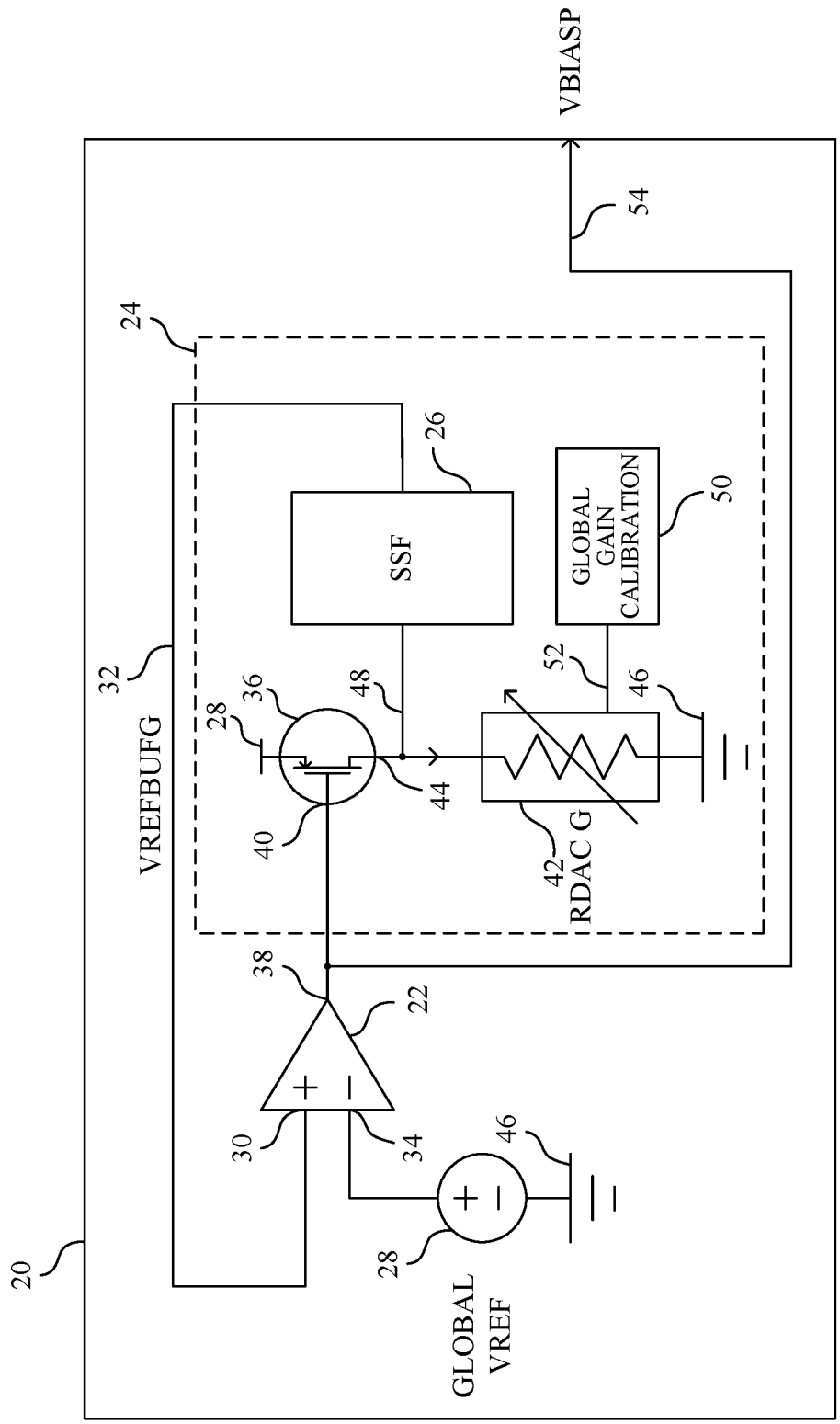
FIG. 2 is circuit diagram of a global reference circuit in accordance with embodiments of the invention.

With reference to FIG. 2, a global reference circuit 20 of the ADC 15 may include an operational amplifier 22 and a global SSF reference buffer 24. The global SSF reference buffer 24 may include a global Super Source Follower (SSF) circuit 26 that, in an embodiment, may be a common drain amplifier representing a voltage-controlled voltage source with unity voltage gain.

In embodiments of the global reference circuit 20, a feedback loop may be used to set an analog voltage at an output 32 of the global SSF circuit 26 (e.g., VREFBUFG)

equal to a constant analog reference voltage supplied from a reference voltage source 28 (e.g., Global VREF). For example, the reference voltage from the reference voltage source 28 may ideally be held at a constant value independent of loading, temperature changes, passage of time, and/or power supply variations.

In embodiments, a non-inverting input 30 of the operational amplifier 22 is coupled to the output 32 of the global SSF circuit 26 and an inverting input 34 of the operational amplifier 22 is coupled to the constant reference voltage 28. In this exemplary configuration, the operational amplifier 22 acts as a comparator that compares voltage at the output 32 of the global SSF circuit 26 to the voltage of the constant reference voltage 28 and produces an output signal (i.e., voltage) based on this comparison.

In some embodiments, a global common source amplifier 36, such as a P-type metal-oxide-semiconductor (PMOS) common source amplifier, provides a current mirror coupled to the output 38 of the operational amplifier 22. For example, the output 38 of the operational amplifier 22 may be coupled to a gate 40 of the global common source amplifier 36. In embodiments, the global SSF reference buffer 24 also includes resistive digital-to-analog converter (RDAC) 42 coupled between a drain 44 of the global common source amplifier 36 and ground 46. The resistive digital-to-analog converter 42 provides a global adjustment circuit for the global SSF reference buffer 24 of the global reference circuit 20. The drain 44 of the global common source amplifier 36 may be coupled to an input 48 of the global SSF circuit 26.

In some embodiments, a global gain calibration circuit 50 may be coupled to the resistive digital-to-analog converter 42. For example, an output 52 of the global gain calibration circuit 50 may be used to change or set a resistance of the resistive digital-to-analog converter 42. Current from the global common source amplifier 36 flowing through the RDAC 42 provides a voltage that is supplied to the global SSF circuit 26. Adjusting the resistance of the RDAC 42 adjusts that voltage.

In some embodiments, the output 54 of the global reference circuit 20 (e.g., VBIASP) may be coupled to the output 38 of the operational amplifier 22 and the gate 40 of the global common source amplifier 36. In some embodiments, the bias voltage from the output 54 is used to drive one or more slices of a SAR ADC.

Figure 3:
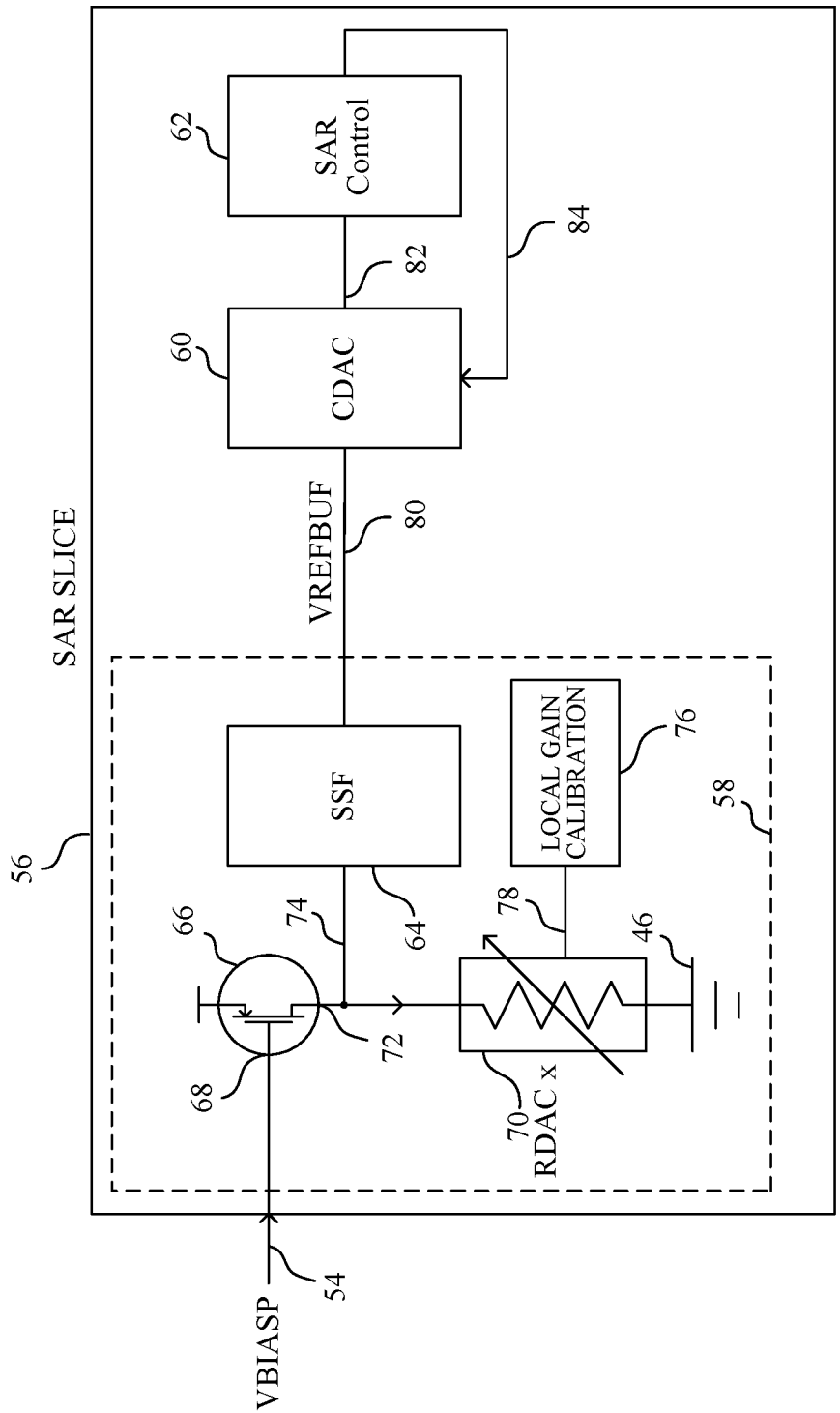
FIG. 3 is a circuit diagram of a local reference circuit in accordance with embodiments of the invention.

With reference to FIG. 3, each of the ADC slices of the SAR 18 may be embodied by a SAR slice 56 that includes a local SSF reference buffer 58, a capacitive digital-to-analog converter (CDAC) 60, and a SAR control circuit 62. In an embodiment, the local SSF reference buffer 58 may include a local SSF circuit 64 (i.e., common drain amplifier) which ideally provides a voltage controlled voltage source with unity voltage gain, offering lower output impedance and amplified current output.

In some embodiments, a local common source amplifier 66, such as a local P-type metal-oxide-semiconductor (PMOS) common source amplifier, provides a current mirror of the output 54 of the global reference circuit 20. For example, the output 54 of the global reference circuit 20 may be coupled to a gate 68 of the local common source amplifier 66. In some embodiments, the local SSF reference buffer 58 also includes a local resistive digital-to-analog converter (RDAC) 70 representing a local adjustment circuit that is coupled between a drain 72 of the local common source amplifier 66 and ground 46. For example, the drain 72 of the local common source amplifier 66 may be coupled to an input 74 of the local SSF circuit 64. Current from the local common source amplifier 66 flowing through the RDAC 70 provides a voltage that is supplied to the local SSF circuit 64. Adjusting the resistance of the RDAC 70 adjusts that voltage.

In some embodiments, a local gain calibration circuit 76 may be coupled to the local adjustment circuit (e.g., RDAC 70). For example, an output 78 of the local gain calibration circuit 76 may be used to change or set a resistance of each RDAC 70.

Moreover, the output 80 (e.g., VREFBUF) of the local SSF circuit 64 may be coupled to an input of the capacitive digital-to-analog converter 60. In some embodiments, an output of the capacitive digital-to-analog converter 60 is coupled to an input of the SAR control circuit 62 via connection 82 and the SAR control circuit 62 feeds back as digital input to the capacitive digital-to-analog converter 60 via connection 84 (e.g., a digital bus). Hence, each SAR slice 56 may take the output 54 of the global reference circuit (e.g., VBIASP) as an input and use it as a bias voltage for a current source, such as a PMOS current source.

The global reference circuit 20 may include a global gain calibration circuit 50 that is coupled with the resistive digital-to-analog converter 42 and that is configured to change or set a resistance of the resistive digital-to-analog converter 42 in order to change the circuit gain. Each SAR slice 56 may include a local gain calibration circuit 76 that is coupled with its local resistive digital-to-analog converter 70 and that is configured to change or set a resistance of the local resistive digital-to-analog converter 70 in order to change the circuit gain.

The resistance of the resistive digital-to-analog converter 42 and the resistance of the local resistive digital-to-analog converter 70 may be calibrated and set by implementing a gain calibration algorithm that controls the global gain calibration circuit 50 and the local gain calibration circuit 76 to set circuit gain. The output 52 of the global gain calibration circuit 50 and/or the output 78 of the local gain calibration circuit 76 may be set by the gain calibration algorithm in a number of different ways or modes.

In an exemplary first mode, the global gain calibration circuit 50 is used to set the resistive digital-to-analog converter 42 to mid-scale (e.g., code 32 for a 6-bit resistive digital-to-analog converter) and the gain calibration algorithm then causes the local gain calibration circuits 76 to subsequently set the values of the local resistive digital-to-analog converters 70 without changing the setting of the resistive digital-to-analog converter 42.

In an exemplary second mode, the global gain calibration circuit 50 is used to set the resistive digital-to-analog converter 42 to mid-scale, and the gain calibration algorithm then causes the local gain adjustment circuits 76 to set the local resistive digital-to-analog converters 70 with values determined by the gain calibration algorithm. The global gain calibration circuit 50 may then reset the value of the resistive digital-to-analog converter 42 to the average of the values determined for the local resistive digital-to-analog converters 70. In an embodiment, the second mode may be iterated multiple times to calibrate the global resistive digital-to-analog converter 42 and the local resistive digital-to-analog converters 70.

In an exemplary third mode, the local gain adjustment circuits 76 are used to set the local resistive digital-to-analog converters 70 to midscale, and then the gain calibration algorithm is used to determine the value of the global resistive digital-to-analog converter 42 on each SAR slice 56, which generate multiple values corresponding to the multiple SAR slices 56. The global gain calibration circuit 50 may then set the value of the global resistive digital-toanalog converter 42 to the average of these multiple values. The gain calibration algorithm may then be run to set the local resistive digital-to-analog converters 70.

Figure 4:
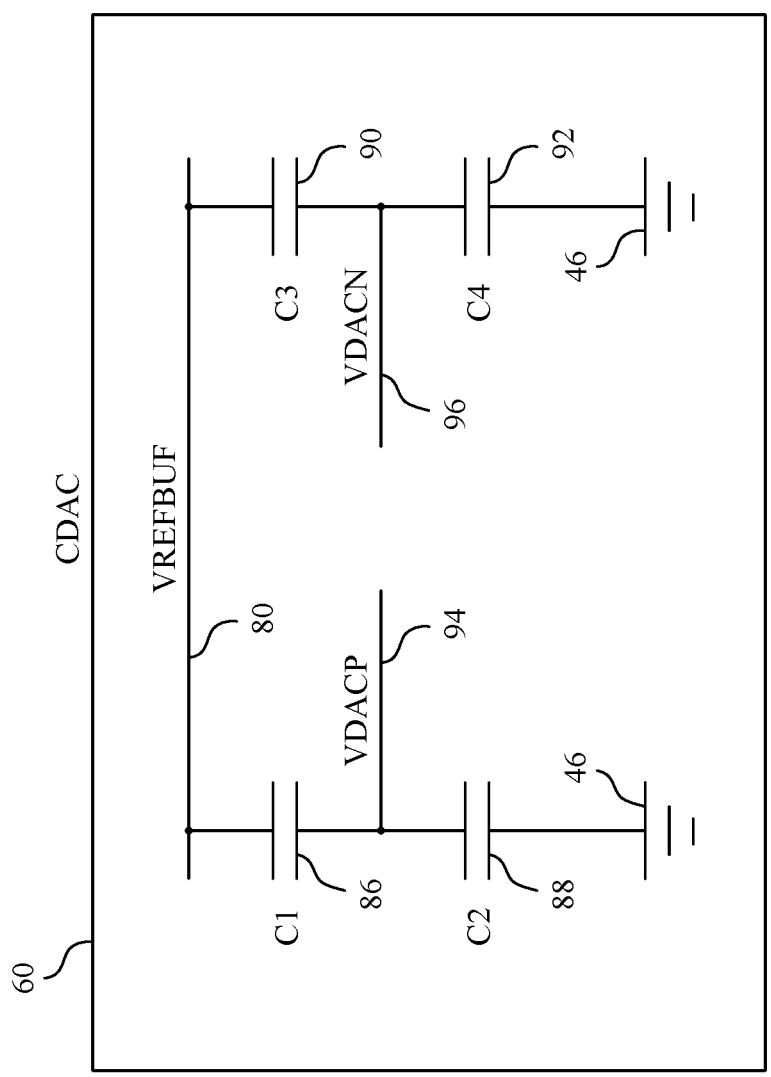
FIG. 4 is a circuit diagram of an embodiment of the capacitive digital-to-analog converter in FIG. 3.

With reference to FIG. 4, the SAR 18 (shown in FIG. 1) may include a capacitive digital-to-analog converter 60 that functions based on charge redistribution, where a capacitor (C1) 86, a capacitor (C2) 88, a capacitor (C3) 90, and a capacitor (C4) 92 are switched between a positive reference voltage (VREFBUF) 80, and ground 46 to set the appropriate output voltages VDACP 94 and VDACN 96. Charge redistribution on the capacitors 86, 88, 90, 92 causes current to be drawn from or sunk by the positive reference voltage VREFBUF at the output 80 and ground 46. Because the capacitance of the capacitors 86, 88, 90, 92 is affected by ambient temperature, the output voltage (e.g., VREFBUF) is affected by temperature drift. Because the local SSF 64 is a source follower based buffer, the source follower device has significant voltage threshold and mobility temperature dependency and, in turn, the gate-to-source voltage (VGS) of this device and, hence, VREFBUF varies significantly with temperature. Because VREFBUF in the capacitive digital-to-analog converter 60 varies with temperature, the gain of the capacitive digital-to-analog converter 60 moves linearly with VREFBUF. Thus, the gain variation experienced by the ADC 15 occurs in an environment where the voltage represented by VREFBUF has temperature drift.

In use, a method may be performed to keep gain constant over temperature for an SAR ADC in accordance with an embodiment. In embodiments, an output of a global SSF reference buffer is compared to a global constant voltage reference using an op-amp and the output of the op-amp is used as a current mirror bias voltage. The current mirror bias voltage is distributed to a plurality of SAR local slices. Each SAR local slice includes a local SSF reference buffer.

In some embodiments, the global SSF reference buffer 24 and at least one of the local SSF reference buffers 58 are independently adjusted. For example, the global SSF reference buffer 24 may supply a voltage to the global SSF circuit 26 via a global current source and the global current source may include a global adjustment circuit (e.g., resistive digital-to-analog converter 42), where adjusting the global adjustment circuit (e.g., changing the resistance of the resistive digital-to-analog converter 42) may change the voltage at the input 48 of the global SSF circuit 26. Similarly, each local SSF reference buffer 58 may supply a voltage to the local SSF circuit 64 via a local current source and the local current source may include a local adjustment circuit (e.g., local resistive digital-to-analog converter 70), where adjusting the local adjustment circuit (e.g., changing the resistance of the local resistive digital-to-analog converter 70) may change the voltage at the input of each local SSF circuit 64.

The replica bias circuit provided in embodiments of the invention allows for gain control by independently controlled DACs, thereby eliminating the need for digital back end gain calibration, as required by conventional ADC lacking the control of gain adjustment in the replica bias circuit. Moreover, compared to prior art and alternative/existing solutions, embodiments have the advantages of less VGA gain range consumed by ADC temperature variation and more signal-to-noise ratio (SNR) at ADC input after temperature drift.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit comprising:
   a global reference circuit including a first current mirror having an input and an output, a first super source follower (SSF) circuit having an input coupled to the output of the first current mirror and an output, a first adjustment circuit coupled to the input of the first SSF circuit, and an operational amplifier including a non-inverting input coupled by a feedback loop to the output of the first SSF circuit, an inverting input coupled to a global constant reference voltage, and an output coupled to the input of the first current mirror; and
   a plurality of successive approximation register (SAR) local slices, each SAR local slice including a second current mirror having an input coupled to the output of the operational amplifier and an output, a second super source follower (SSF) circuit having an input coupled to the output of the second current mirror, and a second adjustment circuit coupled to the input of the second SSF circuit.

2. The circuit of claim 1 wherein the second adjustment circuit included in each SAR local slice is adjustable independently from the second adjustment circuit included in other SAR local slices.

3. The circuit of claim 1 wherein the first adjustment circuit of the global reference circuit is adjustable independently from the second adjustment circuit included in each SAR local slice, the first adjustment circuit is configured to adjust a first voltage at the input of the first SSF circuit, and the second adjustment circuit is configured to adjust a second voltage at the input of the second SSF circuit of each SAR local slice.

4. The circuit of claim 1 wherein the first current mirror includes a common source amplifier having a gate coupled to the output of the operational amplifier and a source coupled to the input of the first SSF circuit.

5. The circuit of claim 1 wherein the first adjustment circuit is a resistive digital-to-analog converter.

6. The circuit of claim 1 wherein the second current mirror includes a P-type metal-oxide-semiconductor common source amplifier having a gate coupled to the output of the operational amplifier and a drain coupled to the input of the second SSF circuit.

7. The circuit of claim 1 wherein the second adjustment circuit of each SAR local slice is a resistive digital-to-analog converter.

8. The circuit of claim 7 wherein the first adjustment circuit is a resistive digital-to-analog converter, and further comprising:
   a first gain calibration circuit configured to adjust the resistive digital-to-analog converter of the global reference circuit; and
   a second gain calibration circuit configured to adjust the resistive digital-to-analog converter of each SAR local slice.

9. The circuit of claim 1 wherein the second SSF circuit has an output, and each SAR local slice includes a capacitive digital-to-analog converter coupled to the output of the second SSF circuit.

10. The circuit of claim 9 wherein each SAR local slice includes a control circuit connected with the capacitive digital-to-analog converter.

11. A method to provide gain compensation for a successive approximation register analog-to-digital converter, the method comprising:
   comparing an output of a global reference buffer to a value of a global constant voltage reference using an operational amplifier;
   supplying a current mirror bias voltage from an output of the operational amplifier;
   distributing the current mirror bias voltage to a plurality of successive approximation register (SAR) local slices;
   adjusting a first voltage at the input of a first super source follower (SSF) circuit of the global reference buffer; and
   adjusting a second voltage at the input of a second super source follower (SSF) circuit of each SAR local slice.

12. The method of claim 11 wherein the second voltage at the input of the second SSF circuit of each SAR local slice is independently adjusted.

13. The method of claim 11 wherein the second voltage at the input of the second SSF circuit of each SAR local slice is adjusted independently of the first voltage at the input of the first SSF circuit.

14. The method of claim 11 wherein supplying the current mirror bias voltage from the output of the operational amplifier comprises:
   controlling a gate of a P-type metal-oxide-semiconductor (PMOS) common source amplifier with the output of the operational amplifier; and
   supplying the first SSF circuit from a drain of the PMOS common source amplifier.

15. The method of claim 11 wherein the global reference buffer includes a resistive digital-to-analog converter, and adjusting the first voltage at the input of the first SSF circuit of the global reference buffer comprises:
   adjusting a resistance of the resistive digital-to-analog converter.

16. The method of claim 11 wherein supplying the current mirror bias voltage from the output of the operational amplifier comprises:
   controlling a gate of a P-type metal-oxide-semiconductor (PMOS) common source amplifier with the output of the operational amplifier; and
   supplying the first SSF circuit with the current mirror bias voltage from a drain of the PMOS common source amplifier.

17. The method of claim 11 wherein each SAR local slice includes a resistive digital-to-analog converter coupled to an input of the second SSF circuit, and adjusting the second voltage at the input of the second SSF circuit of each SAR local slice comprises:
   adjusting a resistance of the resistive digital-to-analog converter of each SAR local slice.

18. The method of claim 17 wherein the global reference buffer includes a resistive digital-to-analog converter, and adjusting the first voltage at the input of the first SSF circuit of the global reference buffer comprises:
   adjusting a resistance of the resistive digital-to-analog converter of the global reference buffer.

19. The method of claim 18 wherein the resistance of the resistive digital-to-analog converter of each local slice and the resistance of the resistive digital-to-analog converter of the global reference buffer are adjusted under control of a gain calibration algorithm.

20. The method of claim 11 further comprising:
   providing a reference voltage from a capacitive digital-to-analog converter to the second SSF circuit of each SAR local slice,
   wherein the reference voltage varies with temperature.

* * * * *